United States Patent
Lee et al.

(10) Patent No.: US 10,553,642 B2
(45) Date of Patent: Feb. 4, 2020

(54) METHOD AND SYSTEM FOR PROVIDING MAGNETIC JUNCTIONS UTILIZING METAL OXIDE LAYER(S)

(71) Applicant: Samsung Electronics Co., LTD., Gyeonggi-do (KR)

(72) Inventors: Don Koun Lee, San Jose, CA (US); Mohamad Towfik Krounbi, San Jose, CA (US); Xueti Tang, Fremont, CA (US); Gen Feng, North Potomac, MD (US); Ikhtiar, Milpitas, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/787,524

(22) Filed: Oct. 18, 2017

(65) Prior Publication Data

US 2019/0067366 A1 Feb. 28, 2019

Related U.S. Application Data

(60) Provisional application No. 62/551,175, filed on Aug. 28, 2017.

(51) Int. Cl.
| | | |
|---|---|---|
| *H01L 43/02* | (2006.01) | |
| *H01L 43/08* | (2006.01) | |
| *H01L 43/10* | (2006.01) | |
| *H01L 43/12* | (2006.01) | |
| *H01L 27/22* | (2006.01) | |

(Continued)

(52) U.S. Cl.
CPC .......... *H01L 27/222* (2013.01); *G11C 11/161* (2013.01); *H01L 43/02* (2013.01); *H01L 43/08* (2013.01); *H01L 43/10* (2013.01); *H01L 43/12* (2013.01)

(58) Field of Classification Search
CPC ....... H01L 27/222; H01L 43/08; H01L 43/02; H01L 43/10; H01L 43/12; H01L 29/82; H01L 29/66007; H01L 43/00–14; H01L 2924/01012; H01L 2924/0532; H01L 2924/0534; H01L 2924/10671; H01L 2924/1434; H01L 2924/1436; H01L 2924/1441; H01L 2924/1443; H01L 27/226; G11C 11/161; G11C 14/0036; G11C 14/0081; G11C 27/022;
(Continued)

(56) References Cited

U.S. PATENT DOCUMENTS

| | | |
|---|---|---|
| 8,852,760 B2 | 10/2014 | Wang |
| 8,946,834 B2 | 3/2015 | Wang |

(Continued)

*Primary Examiner* — Natalia A Gondarenko
(74) *Attorney, Agent, or Firm* — Van Pelt, Yi & James LLP

(57) ABSTRACT

A magnetic junction, a memory using the magnetic junction and method for providing the magnetic junction are described. The magnetic junction resides on a substrate and is usable in a magnetic device. The magnetic junction includes a reference layer, a nonmagnetic spacer layer and a M-containing oxide layer adjacent to the free layer. M includes at least one of Ti, Al, Hf, Zr, Mo, V and Nb. The free layer is switchable between a plurality of stable magnetic states when a write current is passed through the magnetic junction. The nonmagnetic spacer layer is between the reference layer and the free layer. The free layer is between the nonmagnetic spacer layer and the M-containing oxide layer.

15 Claims, 7 Drawing Sheets

(51) Int. Cl.
*G11B 5/39* (2006.01)
*G11C 11/16* (2006.01)

(58) Field of Classification Search
CPC . G11C 2211/5615; G11C 15/02; G11C 15/04;
H01F 1/0036
USPC ................ 257/421–427, 43; 438/3, 728, 746
See application file for complete search history.

(56) References Cited

U.S. PATENT DOCUMENTS

| | | | |
|---|---|---|---|
| 9,276,201 B2 | 3/2016 | Pi | |
| 9,425,387 B1* | 8/2016 | Liu | H01L 43/10 |
| 9,437,268 B2 | 9/2016 | Wang | |
| 9,601,137 B2 | 3/2017 | Zhang | |
| 2009/0269617 A1* | 10/2009 | Zhang | B82Y 10/00 |
| | | | 428/811.1 |
| 2011/0032644 A1* | 2/2011 | Watts | B82Y 25/00 |
| | | | 360/324.12 |
| 2013/0249026 A1* | 9/2013 | Kitagawa | H01L 43/08 |
| | | | 257/421 |
| 2014/0008742 A1* | 1/2014 | Chen | G01R 33/098 |
| | | | 257/421 |
| 2014/0151830 A1* | 6/2014 | Apalkov | H01L 43/08 |
| | | | 257/427 |
| 2015/0008547 A1* | 1/2015 | Pi | H01L 43/04 |
| | | | 257/421 |
| 2015/0333254 A1 | 11/2015 | Liu | |
| 2016/0380188 A1* | 12/2016 | Hu | H01L 43/12 |
| | | | 438/3 |
| 2017/0110506 A1 | 4/2017 | Brown | |
| 2017/0179374 A1* | 6/2017 | Omine | H01F 10/16 |

\* cited by examiner

METHOD AND SYSTEM FOR PROVIDING MAGNETIC JUNCTIONS UTILIZING METAL OXIDE LAYER(S)

CROSS-REFERENCE TO RELATED APPLICATIONS

This application claims the benefit of provisional Patent Application Ser. No. 62/551,175, filed Aug. 28, 2017, entitled TITANIUM OXIDE CAPPING LAYER FOR A FREE LAYER IN PERPENDICULAR MAGNETIC JUNCTIONS, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, a conventional magnetic tunneling junction (MTJ) may be used in a conventional STT-MRAM. The conventional MTJ typically resides on a substrate. The MTJ, uses seed layer(s), may include capping layers and may include an antiferromagnetic (AFM) layer to fix the magnetization of the reference layer. The conventional MTJ includes a reference layer, a free layer and a tunneling barrier layer between the pinned and free layers. A bottom contact below the MTJ and a top contact on the MTJ may be used to drive current through the MTJ in a current-perpendicular-to-plane (CPP) direction. The reference layer and the free layer are magnetic. The magnetization of the reference layer is fixed, or pinned, in a particular direction. The free layer has a changeable magnetization. The free layer and reference layer may be a single layer or include multiple layers.

To switch the magnetization of the free layer, a current is driven in the CPP direction. When a sufficient current is driven from the top contact to the bottom contact, the magnetization of the free layer may switch to be parallel to the magnetization of a bottom reference layer. When a sufficient current is driven from the bottom contact to the top contact, the magnetization of the free layer may switch to be antiparallel to that of the bottom reference layer. The differences in magnetic configurations correspond to different magnetoresistances and thus different logical states (e.g. a logical "0" and a logical "1") of the conventional MTJ.

Because of their potential for use in a variety of applications, research in magnetic memories is ongoing. For example, a low switching current, sufficient thermal stability and high perpendicular magnetic anisotropy may be desired for improved write efficiency and data retention. These properties are desired to be present in the magnetic junctions in the final device. Accordingly, what is needed is a method and system that may improve the performance of spin transfer torque based memories and the electronic devices in which such memories are used. The method and system described herein address such a need.

BRIEF SUMMARY OF THE INVENTION

A magnetic junction, a memory using the magnetic junction and method for providing the magnetic junction are described. The magnetic junction resides on a substrate and is usable in a magnetic device. The magnetic junction includes a reference layer, a nonmagnetic spacer layer and a M-containing oxide layer adjacent to the free layer. M includes at least one of Ti, Al, Hf, Zr, Mo, V, and Nb. The free layer is switchable between a plurality of stable magnetic states when a write current is passed through the magnetic junction. The nonmagnetic spacer layer is between the reference layer and the free layer. The free layer is between the nonmagnetic spacer layer and the M-containing oxide layer.

The magnetic junction may have improved resistance to degradation after high temperature anneals. As a result, performance may be improved.

DETAILED DESCRIPTION OF THE INVENTION

Figure 1A:
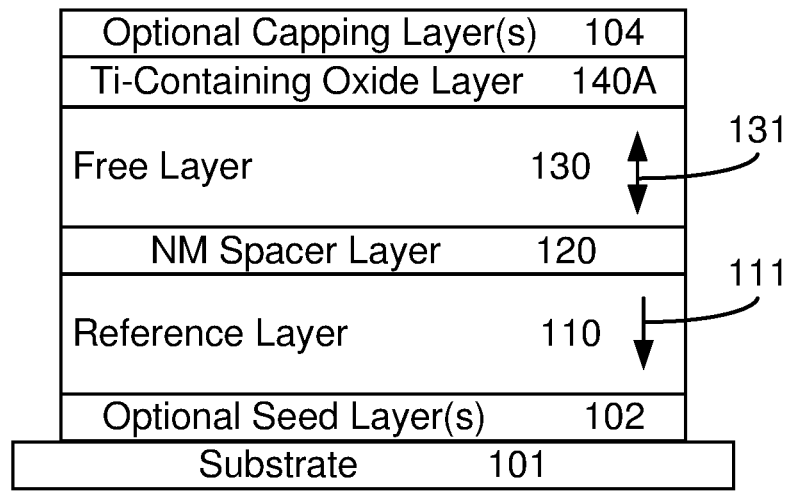
FIGS. 1A-1B depict exemplary embodiments of a magnetic junction usable in a magnetic memory, programmable using spin transfer torque and including at least one M-containing oxide layer.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or fewer components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

A magnetic junction, a memory using the magnetic junction and method for providing the magnetic junction are described. The magnetic junction resides on a substrate and is usable in a magnetic device. The magnetic junction includes a reference layer, a nonmagnetic spacer layer and at least one M-containing oxide layer adjacent to the free layer. M includes at least one of Ti, Al, Hf, Zr, Mo, V, and Nb. The free layer is switchable between a plurality of stable magnetic states when a write current is passed through the magnetic junction. The nonmagnetic spacer layer is between the reference layer and the free layer. The free layer is between the nonmagnetic spacer layer and the M-containing oxide layer.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. One of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. One of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction. The method and system are also described in the context of certain alloys. Unless otherwise specified, if specific concentrations of the alloy are not mentioned, any stoichiometry not inconsistent with the method and system may be used.

Figure 1B:
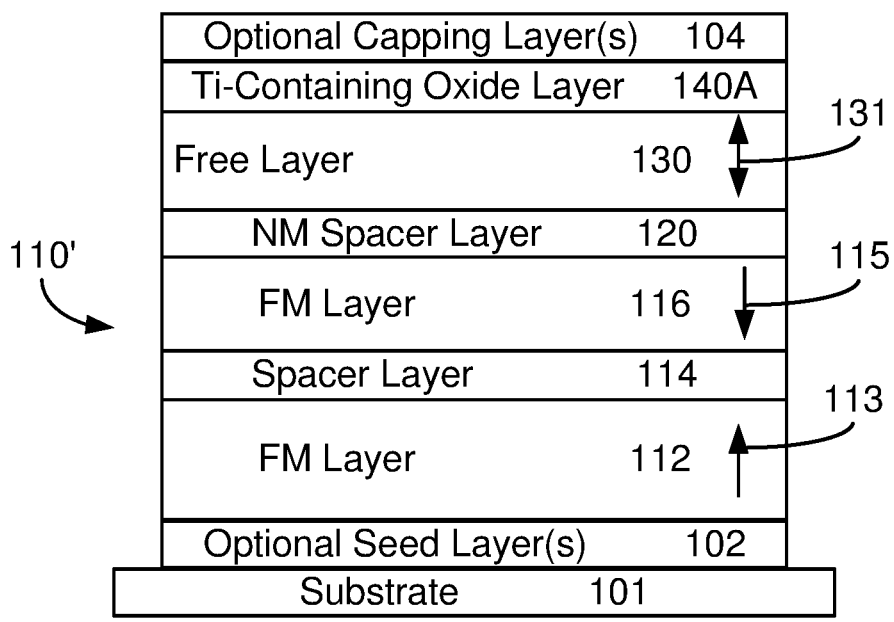

FIGS. 1A and 1B depict exemplary embodiments of a magnetic junction 100A and a magnetic junction 100A' usable in a magnetic memory, programmable using spin transfer torque and including at least one metal "M" containing oxide where M is at least one of Ti, Al, Hf, Zr, Mo, V, and Nb. For clarity, FIGS. 1A and 1B are not to scale and not all components may be shown. The magnetic junctions 100A and 100A' may be used in a magnetic device such as a spin transfer torque magnetic random access memory (STT-MRAM) and, therefore, in a variety of electronic devices.

Referring to FIG. 1A the magnetic junction 100A may include a reference layer 110 having a magnetic moment 111, a nonmagnetic spacer layer 120, a free layer 130 having magnetic moment 131 and M-containing oxide layer(s) 140A. Also shown are optional seed layer(s) 102 and capping layer(s) 104. The substrate 101 on which the magnetic junction 100 is formed resides below the seed layers and is shown for clarity. A bottom contact and a top contact are not shown but may be formed. Other layers such as polarization enhancement layers (PELs), coupling layers and antiferromagnetic (AFM) or other layers and/or other layers may be present. However, such layers are not shown for simplicity.

As can be seen in FIG. 1A, the magnetic junction 100A has its reference layer 110 closest to the substrate 101. The magnetic junction 100A is a bottom pinned magnetic junction. In another embodiment, the layers 110, 120, 130 and 140A may be reversed. In such an embodiment, the magnetic junction would be a top pinned magnetic junction. Optional pinning layer(s) (not shown) may be used to fix the magnetization of the reference layer 110, particularly if the magnetic moment 111 of the reference layer 110 were in-plane. In some embodiments, the optional pinning layer may be an AFM layer or multilayer that pins the magnetization(s) through an exchange-bias interaction. However, in other embodiments, the optional pinning layer may be omitted or another structure may be used. In the embodiment shown, the magnetic moment 111 of the reference layer 110 is pinned by the magnetic anisotropy of the reference layer 110. Further, one or more of the layers 110, 120, 130 and 140A may be a multilayer.

The free layer 130 and the reference layer 110 each have a high perpendicular magnetic anisotropy (PMA). Therefore, the perpendicular magnetic anisotropy energy exceeds the out-of-plane demagnetization energy for each of the layers 110 and 130. Such a configuration allows for the magnetic moments 111 and 131 of the free layer 130 and reference layer 110 to be stable out-of-plane. In other embodiments, the layer(s) 110 and/or 130 may not have a high PMA. In such embodiments, the magnetic moment(s) 112 and/or 132 may be stable in-plane.

The magnetic junction 100A is also configured to allow the free layer magnetic moment 131 to be switched between stable magnetic states when a write current is passed through the magnetic junction 100A. Thus, the free layer 130 is switchable utilizing spin transfer torque when a write current is driven through the magnetic junction 100A in a current perpendicular-to-plane (CPP) direction. The direction of the magnetic moment 131 of the free layer 108 may be read by driving a read current through the magnetic junction 100A.

The reference layer 110 has a PMA energy greater than a reference layer out-of-plane demagnetization energy. Thus, the moment 111 is stable perpendicular-to-plane. In alternate embodiments, the magnetic moment 111 may be stable in-plane. The reference layer 110 is shown as being simple, single layers. However, in other embodiments, the reference layer 110 may be a multilayer. For example, the reference layer(s) 110 might be a synthetic antiferromagnet (SAF) including multiple magnetically coupled ferromagnetic layers sandwiching and interleaved with nonmagnetic layer(s), such as Ru. One such reference layer is depicted in FIG. 1B. The reference layer 110 may include one or more high perpendicular anisotropy ($H_k$) multilayer(s). For example, the reference layer 110 may be a Co/Pt multilayer. Other reference layer(s) having other structures and/or using other materials may be used.

The nonmagnetic spacer layer 120 may be a tunneling barrier layer. For example, the nonmagnetic spacer 120 may be a crystalline MgO tunneling barrier with a (100) orientation. Such a nonmagnetic spacer layer 120 may not only enhance TMR of the magnetic junction 100A, but also increase the PMA of the free layer 130. A crystalline MgO tunneling barrier layer 120 may have a thickness of at least eight Angstroms and not more than fifteen Angstroms. For example, a crystalline MgO tunneling barrier layer 120 may be nominally at least ten and not more than twelve Angstroms thick. The nonmagnetic spacer layer 120 may also be considered to serve as a seed layer for the free layer 130. In an alternate embodiment, the nonmagnetic spacer layer 120 may have another structure including but not limited to being a conductive layer.

The free layer 130 may have a high PMA. Thus, the free layer 130 has a PMA energy greater than a reference layer out-of-plane demagnetization energy. Thus, the moment 131 is stable perpendicular-to-plane. In alternate embodiments, the magnetic moment 131 may be stable in-plane. The free layer is shown as being a simple, single layer. However, in other embodiments, the free layer 130 may be a multilayer. For example, the free layer 130 might be a SAF or other multilayer. In some embodiments, the free layer may include or consist of an Fe layer, a CoFeB layer and/or a CoFeNiB layer. Other or additional alloys and/or multilayers may be used in other embodiments. The alloys listed above refer to those containing the named elements, but for which the stoichiometries that are not specified. For example, CoFeB refer to mixtures including Co, Fe and B but in which the ratios between the constituents is not specified. CoFeB may be $(CoFe)_{1-y}B_y$, where $0 \leq y < 1$. In some embodiments, CoFeB includes at least ten atomic percent and not more than sixty atomic percent B (i.e. y is at least 0.1 and not more than 0.6). In some such embodiments, the CoFeB includes not more than forty atomic percent B and at least twenty atomic percent B (i.e. $0.2 \leq y \leq 0.4$). Similarly, a CoFeNiB layer refers to a layer with to the $(CoFeNi)_{1-y}B_y$, where $0 \leq y < 1$. Such a CoFeNiB may have similar concentrations of B as the CoFeB layer. For example, a CoFeNiB layer may have at least twenty atomic percent and not more than forty atomic percent of B. Further, other and/or different layers and/or materials may be used in the free layer 130.

The M-containing oxide layer 140A is adjacent to the free layer 130. M includes at least one of Ti, Al, Hf, Zr, Mo, V, and Nb. Thus, the M-containing oxide layer 140A is an oxide that also includes one or more of the above materials. In some embodiments, the M-containing oxide layer 140A shares an interface with, or adjoins, the free layer 130. In other embodiments, another layer (not shown) may be between the free layer 130 and the M-containing oxide layer 140A. The M-containing oxide layer 140A is generally thinner than the nonmagnetic spacer layer 120 for embodiments in which the nonmagnetic spacer layer 120 is a tunneling barrier layer. The M-containing oxide layer 140A may be nominally half of the thickness of the tunneling barrier layer. The M-containing oxide layer 140A may be at least three Angstroms thick and not more than ten Angstroms thick. In some embodiments, the M-containing oxide layer 140A may be at least four Angstroms and not more than eight Angstroms thick. In some such embodiments, the M-containing oxide layer 140A may be at least five Angstroms thick and not more than six Angstroms thick. In other embodiments, other thicknesses are possible.

The M-containing oxide layer 140A may include both magnesium and M. The M-containing oxide layer 140A may include $[MgM_x]O_y$, where x is not more than 3, y is not more than 5 and M is at least one of Ti, Al, Hf, Zr, Mo, V, and Nb as discussed above. For example, if Ti is used, the MgTi may be at least two atomic percent Ti and not more than ten atomic percent Ti. Other stoichiometries are possible. The M-containing oxide layer 140A may be formed by depositing metallic layer(s) and performing an oxide treatment. In some such embodiment, a plasma treatment may be performed after deposition of the metallic layer(s) and before the oxide treatment. In other embodiments, the M-containing oxide layer 140A may be radio-frequency (RF) sputtered.

The M-containing oxide layer 140A may improve the performance of the free layer 130, particularly for a $MgM_xO_y$ layer 140A, where x and y 5. For example, the Mg-containing and M-containing oxide layer 140A may increase the PMA of the free layer 140 and/or reduce the magnitude of the switching current for the free layer 140. The M-containing oxide layer 140A aids the free layer 130 in being less sensitive to higher temperature anneals. This is particularly true for an $MgM_xO_y$, where $x \leq 3$ and $y \leq 5$ oxide layer 140A. For example, the free layer 130 may be characterized by a coercivity, a thermal stability coefficient and a write efficiency. Other magnetic properties may be of interest in addition to or in lieu of one or more of these magnetic properties. The magnetic thermal stability coefficient of a ferromagnetic layer is given by $\Delta = K_u V/k_B T$, where $K_u$ is a magnetic anisotropy density of the layer, $k_b$ is Boltzman's constant, T is temperature in Kelvin and V is the volume of the magnetic layer. For the free layer 130 to be thermally stable, the magnetic thermal stability coefficient of the free layer 130, $\Delta_{free\ layer}$, is generally desired to be at least sixty at non-programming operating temperatures, or standby temperatures such as at and around room temperature. In the absence of the M-containing oxide layer, the magnetic thermal stability constant of the free layer may be reduced if the free layer undergoes a high temperature anneal at an anneal temperature of at least four hundred degrees Celsius. For example, if an MgO layer is used in place of the M-containing oxide layer, the high free layer PMA obtained from the presence of the MgO layer may be reduced or lost after such an anneal. Similarly, coercivity and/or write efficiency may also be reduced if the free layer undergoes a high temperature anneal at an anneal temperature of at least four hundred degrees Celsius and the free layer is not adjacent to a M-containing oxide layer. In contrast, the magnetic thermal stability constant, coercivity and/or write efficiency of the free layer 130 may not decrease by more than five percent for an anneal at temperatures of up to four hundred degrees Celsius if the M-containing oxide layer 140A is present. In some embodiments, the magnetic thermal stability constant, coercivity and/or write efficiency of the free layer 130 may not decrease by more than five percent for an anneal at temperatures of up to four hundred and fifty degrees Celsius if the M-containing oxide layer 140A is present. In some embodiments, the magnetic thermal stability constant of the free layer 130 might increase for anneals at temperatures not exceeding four hundred degrees Celsius.

The magnetic junction 100A having the M-containing oxide layer 140A may have improved performance. An Mg-containing and M-containing oxide layer 140A may improve the PMA and switching characteristics of the free layer 130. This reduction in switching current may also improve other aspects of performance, such as switching speed. The inclusion of M as discussed above aids in preserving the desired magnetic characteristics of the free layer 130 during higher temperature anneals. As part of back end processing of a magnetic device, such as a magnetic memory, higher temperature anneals are desired. For example, semiconductor devices often undergo anneals at temperatures of up to four hundred degrees Celsius. If M is not present in an oxide layer occupying the same position as the M-containing oxide layer 140A, the free layer 130/magnetic junction 100A undergoing such an anneal may suffer a degradation in characteristics such as magnetic thermal stability constant, the coercivity and/or write efficiency. In contrast, in the presence of the M-containing oxide layer 140A, particularly if Mg is also present, these characteristics may not unduly suffer for anneals in the same temperature range. Consequently, processes used in fabrication of semiconductor devices may be used in manufacturing of an MRAM including the magnetic junction 100A substantially without adversely affecting performance of the magnetic junction 100A. The magnetic junction 100A may be more easily and better incorporated into an electronic device.

FIG. 1B depicts a magnetic junction 100A'. For clarity, FIG. 1B is not to scale and not all components may be shown. The magnetic junction 100A' is analogous to the magnetic junction 100A. Consequently, similar components have analogous labels. The magnetic junction 100A' includes reference layer 110', nonmagnetic spacer layer 120, free layer 130 having magnetic moment 131 and M-containing oxide layer 140A that are analogous to the reference layer 110, nonmagnetic spacer layer 120, free layer 130, and M-containing oxide layer 140A, respectively. M includes at least one of Ti, Al, Hf, Zr, Mo, V, and Nb as described above. Optional seed layer 102 and capping layer 104 as well as the substrate 101 are also shown.

The structure, function and material(s) used for the nonmagnetic spacer layer 120, free layer 130 and M-containing oxide layer 140A in the magnetic junction 100A' are analogous to those used in the magnetic junction 100A. For example, the M-containing oxide layer 140A may include $MgM_xO_y$, $x \leq 3$ and $y \leq 5$ in the thicknesses described above. Similarly, the free layer 130 may be a single layer or a multilayer and may be is written using spin transfer.

The reference layer 110' is explicitly shown as a SAF. Thus, the reference layer 110' includes two ferromagnetic layers 112 and 116 separated by a spacer layer 114 that is nonmagnetic. The ferromagnetic layers 112 and 116 have magnetic moments 113 and 115, respectively. The spacer layer 114 moderates the magnetic coupling between the ferromagnetic layers 112 and 116 and may include material(s) such as Ru. In the embodiment shown, the thickness of the spacer layer 114 is such that the ferromagnetic layers 112 and 116 are antiferromagnetically coupled, for example via a Ruderman-Kittel-Kasuya-Yosida (RKKY) coupling. Thus, the magnetic moments 113 and 115 are antiparallel. Although shown as single layers, one or both of the ferromagnetic layers 112 and 116 may be a multilayer. Although only two ferromagnetic layers 112 and 116 and one spacer layer 114 are shown, more layers may be present. For example, three ferromagnetic layers interleaved with two spacer layers might be used. The ferromagnetic layers 112 and 116 each has a PMA energy greater than a reference layer out-of-plane demagnetization energy. Thus, the moments 113 and 115 are stable perpendicular-to-plane.

The magnetic junction 100A' shares the benefits of the magnetic junction 100A. The magnetic junction 100A' having the M-containing oxide layer 140A may have improved performance despite the use of higher temperature anneals. An Mg-containing and M-containing oxide layer 140A may improve the PMA, coercivity, thermal stability constant and write efficiency. Further, because of the inclusion of M, these characteristics may not be unduly degraded after anneals of up to four hundred degrees Celsius or higher. For example, the magnetic thermal stability constant, coercivity and write efficiency may not degrade by more than five percent despite anneal(s) of the magnetic junction 100A' at temperatures of up to four hundred degrees Celsius or up to four hundred and fifty degrees Celsius. Thus, processes such as those used in semiconductor devices may be part of fabrication of a magnetic device, such as STT-MRAM, including the magnetic junction 100A'. Consequently, the magnetic junction 100A' may be more easily and better incorporated into an electronic device without its performance unduly adversely affected.

Figure 2A:
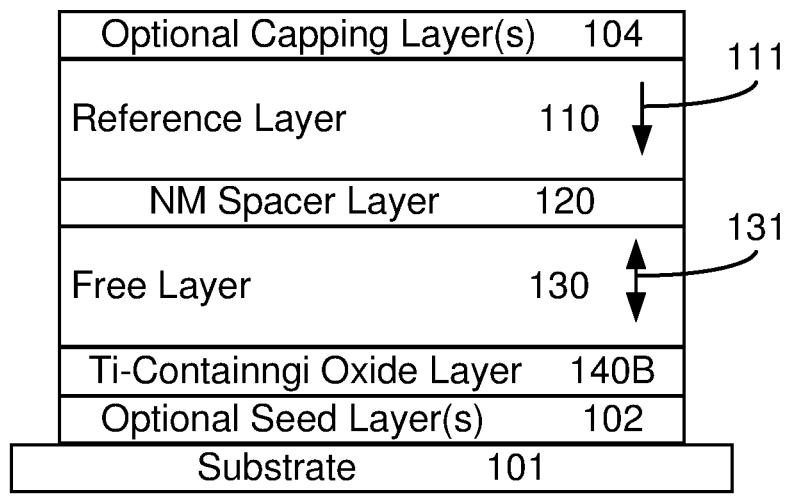
FIGS. 2A-2B depict exemplary embodiments of another magnetic junction usable in a magnetic memory, programmable using spin transfer torque and including at least one M-containing oxide layer.

FIG. 2A depicts another exemplary embodiment of a magnetic junction 100B in magnetic devices such as a magnetic memory programmable using spin transfer torque. For clarity, FIG. 2A is not to scale and not all components may be shown. The magnetic junction 100B is analogous to the magnetic junctions 100A and/or 100A'. Consequently, similar components have analogous labels. The magnetic junction 100B is a top pinned magnetic junction that includes reference layer 110, nonmagnetic spacer layer 120, free layer 130 having magnetic moment 131 and M-containing oxide layer 140B that are analogous to the reference layer 110, nonmagnetic spacer layer 120, free layer 130 having magnetic moment 131 and M-containing oxide layer 140A, respectively. M includes at least one of Ti, Al, Hf, Zr, Mo, V, and Nb as described above. Optional seed layer 102 and capping layer 104 as well as the substrate 101 are also shown.

The structure, function and material(s) used for the reference layer 110, nonmagnetic spacer layer 120, free layer 130 and M-containing oxide layer 140B in the magnetic junction 100B are analogous to those used for the reference layer 110/110', nonmagnetic spacer layer 120, free layer 130 and M-containing oxide layer 140A in the magnetic junctions 100A and 100A'. For example, the M-containing oxide layer 140B may include $MgM_xO_y$ in the thicknesses described above with respect to the M-containing oxide layer 140A. Similarly, the free layer 130 may be a single layer or a multilayer and may be is written using spin transfer. However, the order of the layers with respect to the substrate 101 has been changed. The magnetic junction 100B is a top pinned magnetic junction, while the magnetic junctions 100A and 100A' are bottom pinned magnetic junctions.

The magnetic junction 100B may share the benefits of the magnetic junctions 100A and/or 100A'. The magnetic junction 100B having the M-containing oxide layer 140B may have improved performance despite the use of higher temperature anneals. An Mg-containing and M-containing oxide layer 140B may improve the PMA, coercivity, thermal stability constant and write efficiency. Further, because of the inclusion of M, these characteristics may not be degraded by more than five percent after anneals at anneal temperatures of up to four hundred degrees Celsius, up to four hundred fifty degrees Celsius or, in some embodiments, higher temperatures. Thus, processes such as those used in semiconductor devices may be part of fabrication of a magnetic device including the magnetic junction 100B. Consequently, the magnetic junction 100B may be more easily and better incorporated into an electronic device without its performance unduly adversely affected.

Figure 2B:
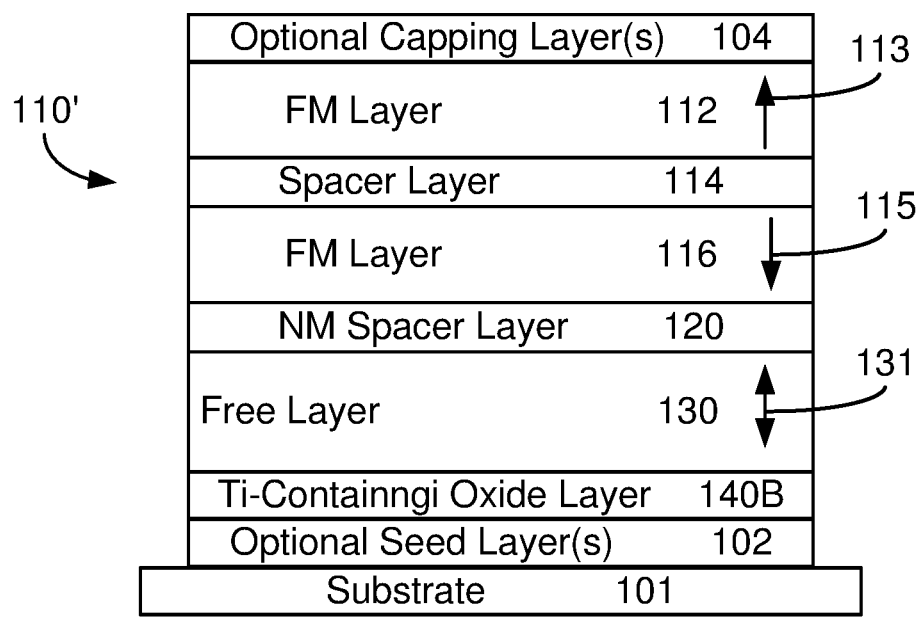

FIG. 2B depicts a magnetic junction 100B'. For clarity, FIG. 2B is not to scale and not all components may be shown. The magnetic junction 100B' is analogous to the magnetic junction(s) 100A, 100A' and/or 100B. Consequently, similar components have analogous labels. The magnetic junction 100B' includes reference layer 110', nonmagnetic spacer layer 120, free layer 130 having magnetic moment 131 and M-containing oxide layer 140B that are analogous to the reference layer 110/110', nonmagnetic spacer layer 120, free layer 130, and M-containing oxide layer 140A/140B, respectively. Optional seed layer 102 and capping layer 104 as well as the substrate 101 are also shown.

The structure, function and material(s) used for the nonmagnetic spacer layer 120, free layer 130 and M-containing oxide layer 140B in the magnetic junction 100B' are analogous to those used in the magnetic junction(s) 100A, 100A' and/or 100B. For example, the M-containing oxide layer 140B may include $MgM_xO_y$ in the thicknesses described above. Similarly, the free layer 130 may be a single layer or a multilayer and may be is written using spin transfer.

The reference layer 110' includes two ferromagnetic layers 112 and 116 separated by a spacer layer 114 that is nonmagnetic. Thus, the reference layer 110' depicted in FIG. 2B is explicitly shown as a SAF and most analogous to the reference layer 110' of FIG. 1B. The ferromagnetic layers 112 and 116 have magnetic moments 113 and 115, respectively. The spacer layer 114 moderates the magnetic coupling between the ferromagnetic layers 112 and 116 and may include material(s) such as Ru. The thickness of the spacer layer 114 in FIG. 2B is such that the ferromagnetic layers 112 and 116 are antiferromagnetically coupled, for example via an RKKY coupling. Although shown as single layers, one or both of the ferromagnetic layers 112 and 116 may be a multilayer. Although only two ferromagnetic layers 112 and 116 and one spacer layer 114 are shown, more layers may be present. For example, three ferromagnetic layers interleaved with two spacer layers might be used.

The magnetic junction 100B' shares the benefits of the magnetic junction(s) 100A, 100A' and/or 100B. The magnetic junction 100B' having the M-containing oxide layer 140B may have improved performance despite the use of higher temperature anneals. An Mg-containing and M-containing oxide layer 140B may improve the PMA, coercivity, thermal stability constant and write efficiency. Because of the presence of M, these characteristics may not degrade by more than five percent despite anneal(s) of the magnetic junction 100A' at temperatures of up to four hundred degrees Celsius, up to four hundred and fifty degrees Celsius, or, in some embodiments, higher anneal temperature(s). Thus, processes such as those used in semiconductor devices may be part of fabrication of a magnetic device including the magnetic junction 100B'. Consequently, the magnetic junction 100B' may be more easily and better incorporated into an electronic device without its performance unduly adversely affected.

Figure 3A:
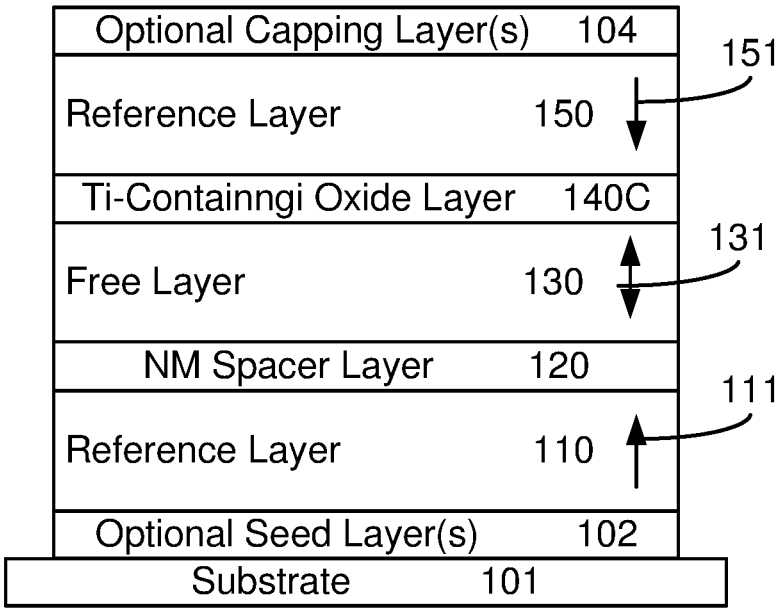
FIGS. 3A-3B depict exemplary embodiments of another magnetic junction usable in a magnetic memory, programmable using spin transfer torque and including at least one M-containing oxide layer.

FIG. 3A depicts another exemplary embodiment of a magnetic junction 100C in magnetic devices such as a magnetic memory programmable using spin transfer torque. For clarity, FIG. 3A is not to scale and not all components may be shown. The magnetic junction 100C is analogous to the magnetic junctions 100A, 100A', 100B and/or 100B'. Consequently, similar components have analogous labels. The magnetic junction 100C is a dual magnetic junction that includes reference layer 110, nonmagnetic spacer layer 120, free layer 130 having magnetic moment 131 and M-containing oxide layer 140C that are analogous to the reference layer 110, nonmagnetic spacer layer 120, free layer 130 having magnetic moment 131 and M-containing oxide layer 140A/140B, respectively. M includes at least one of Ti, Al, Hf, Zr, Mo, V, and Nb as described above. Optional seed layer 102 and capping layer 104 as well as the substrate 101 are also shown.

The structure, function and material(s) used for the reference layer 110, nonmagnetic spacer layer 120, free layer 130 and M-containing oxide layer 140C in the magnetic junction 100C are analogous to those used for the reference layer 110/110', nonmagnetic spacer layer 120, free layer 130 and M-containing oxide layer 140A/140B in the magnetic junctions 100A, 100A', 100B and 100B'. For example, the M-containing oxide layer 140C may include $MgM_xO_y$ in the thicknesses described above with respect to the M-containing oxide layer 140A/140B/140C. Similarly, the free layer 130 may be a single layer or a multilayer and may be is written using spin transfer.

The magnetic junction 100C also includes an additional reference layer 150 having magnetic moment 151. In the embodiment shown, the M-containing oxide layer 140C also operates as a nonmagnetic tunneling barrier layer between the free layer 130 and the reference layer 150. The magnetic junction 100C is, therefore, a dual magnetic junction. The reference layer 150 has a PMA energy greater than a reference layer out-of-plane demagnetization energy. Thus, the moment 151 of the reference layer 150 is stable perpendicular-to-plane. In the embodiment shown, the magnetic moments 111 and 151 are aligned antiparallel (dual state). However, in other embodiments, the moments 111 and 151 might be aligned parallel (antidual state). Other orientations are possible. The reference layer 150 is analogous to the reference layer 110/110' and may include similar materials. The reference layer 150 may be a single layer as shown or a multilayer. The thickness and magnetic properties of the reference layer 150 may be analogous to the reference layer(s) 110/110'.

Use of a dual magnetic junction 100C in the dual state (moments 111 and 151 antiparallel) may allow for a smaller write current for spin transfer. If the dual magnetic junction 100C is in the antidual state (moments 111 and 151 parallel), a larger signal may be achieved. The magnetic junction 100C may also share the benefits of the magnetic junctions 100A, 100A', 100B and/or 100B'. The magnetic junction 100C having the M-containing oxide layer 140C may have improved performance despite the use of higher temperature anneals. An Mg-containing and M-containing oxide layer 140C may improve the PMA, coercivity, thermal stability constant and write efficiency. Further, because of the inclusion of M, these characteristics may not be degraded by more than five percent after anneals of up to four hundred degrees Celsius, for hundred fifty degrees Celsius or, in some embodiments, higher temperatures. Thus, processes such as those used in semiconductor devices may be part of fabrication of a magnetic device including the magnetic junction 100C. Consequently, the magnetic junction 100C may be more easily and better incorporated into an electronic device without its performance unduly adversely affected.

Figure 3B:
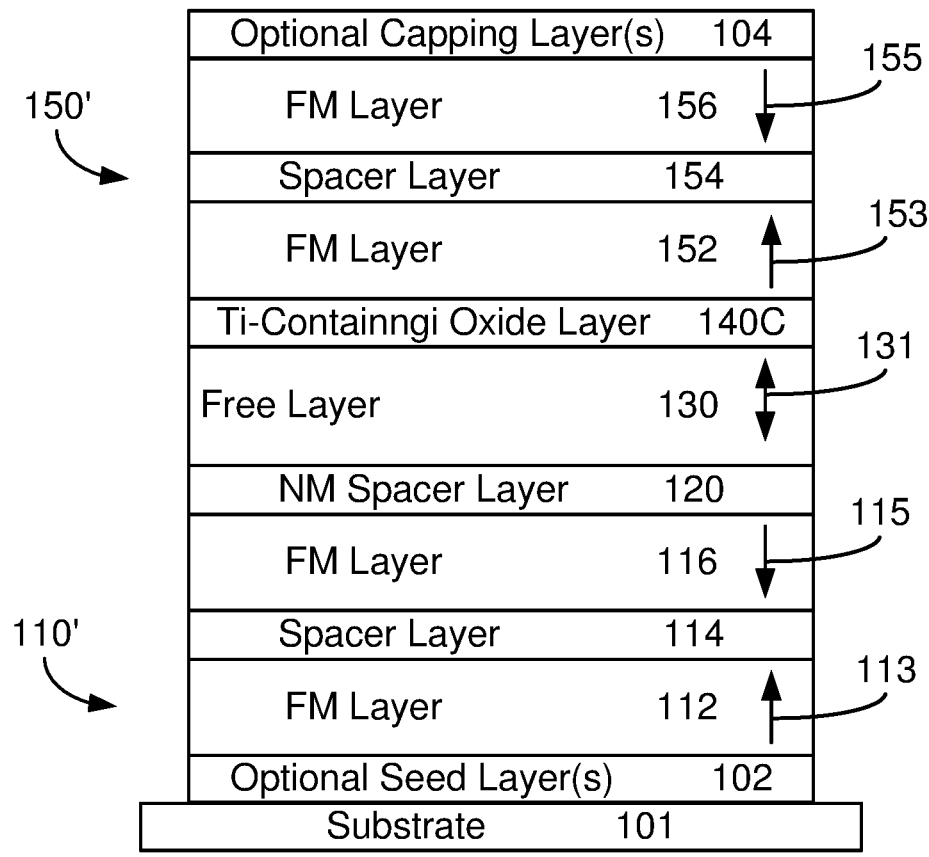

FIG. 3B depicts a magnetic junction 100C'. For clarity, FIG. 3B is not to scale and not all components may be shown. The magnetic junction 100C' is analogous to the magnetic junction(s) 100A, 100A', 100B, 100B' and/or 100C. Consequently, similar components have analogous labels. The magnetic junction 100C' includes reference layer 110', nonmagnetic spacer layer 120, free layer 130 having magnetic moment 131, M-containing oxide layer 140C and reference layer 150' that are analogous to the reference layer 110/110', nonmagnetic spacer layer 120, free layer 130, and M-containing oxide layer 140A/140B/140C and reference layer 150, respectively. M includes at least one of Ti, Al, Hf, Zr, Mo, V, and Nb as described above. Optional seed layer 102 and capping layer 104 as well as the substrate 101 are also shown.

The structure, function and material(s) used for the nonmagnetic spacer layer 120, free layer 130 and M-containing oxide layer 140C in the magnetic junction 100C' are analogous to those used in the magnetic junction(s) 100A, 100A', 100B, 100B' and/or 100C. For example, the M-containing oxide layer 140C may include $MgM_xO_y$ in the thicknesses described above. Similarly, the free layer 130 may be a single layer or a multilayer and may be is written using spin transfer.

The reference layer 110' includes two ferromagnetic layers 112 and 116 separated by a spacer layer 114 that is nonmagnetic. The ferromagnetic layers 112 and 116 have magnetic moments 113 and 115, respectively. Thus, the reference layer 110' depicted in FIG. 3B is explicitly shown as a SAF and most analogous to the reference layer 110' of FIGS. 1B and 2B.

Similarly, the reference layer 150 includes two ferromagnetic layers 152 and 156 separated by a spacer layer 154 that is nonmagnetic. The ferromagnetic layers 152 and 156 have magnetic moments 153 and 155, respectively. The spacer layer 154 moderates the magnetic coupling between the ferromagnetic layers 152 and 156 and may include material(s) such as Ru. The thickness of the spacer layer 154 in FIG. 3B is such that the ferromagnetic layers 152 and 156 are antiferromagnetically coupled, for example via an RKKY coupling. Although shown as single layers, one or both of the ferromagnetic layers 152 and 156 may be a multilayer. Although only two ferromagnetic layers 152 and 156 and one spacer layer 154 are shown, more layers may be present. For example, three ferromagnetic layers interleaved with two spacer layers might be used. Thus, the reference layer 150' depicted in FIG. 3B is explicitly shown as a SAF and most analogous to the reference layer 110' of FIGS. 1B and 2B.

Both reference layers 110' and 150' are shown as being SAFs in FIG. 3B. In other embodiments, only one reference layer 110' or 150' is a SAF while the other is not. Thus, in one embodiment, the reference layer 110' may be a SAF while the reference layer 150' may be a single layer or a non-SAF multilayer. In another embodiment the reference layer 150' may be a SAF while the reference layer 110' may be a single layer or a non-SAF multilayer.

The magnetic junction 100C' shares the benefits of the magnetic junction(s) 100A, 100A', 100B, 100B' and/or 100C. Use of a dual magnetic junction 100C' in the dual state (moments 115 and 153 antiparallel as shown) may allow for a smaller write current for spin transfer. If the dual magnetic junction 100C' is in the antidual state (moments 115 and 153 parallel, which is not shown), a larger signal may be achieved. The magnetic junction 100C' having the M-containing oxide layer 140C may also have improved performance despite the use of higher temperature anneals. An Mg-containing and M-containing oxide layer 140C may improve the PMA, coercivity, thermal stability constant and write efficiency. Because of the presence of M, these characteristics may not degrade by more than five percent despite anneal(s) of the magnetic junction 100C' at temperatures of up to four hundred degrees Celsius, up to four hundred and fifty degrees Celsius, or, in some embodiments, higher anneal temperature(s). Thus, processes such as those used in semiconductor devices may be part of fabrication of an electronic device including the magnetic junction 100C'. Consequently, the magnetic junction 100C' may be more easily and better incorporated into an electronic device without its performance unduly adversely affected.

Figure 4A:
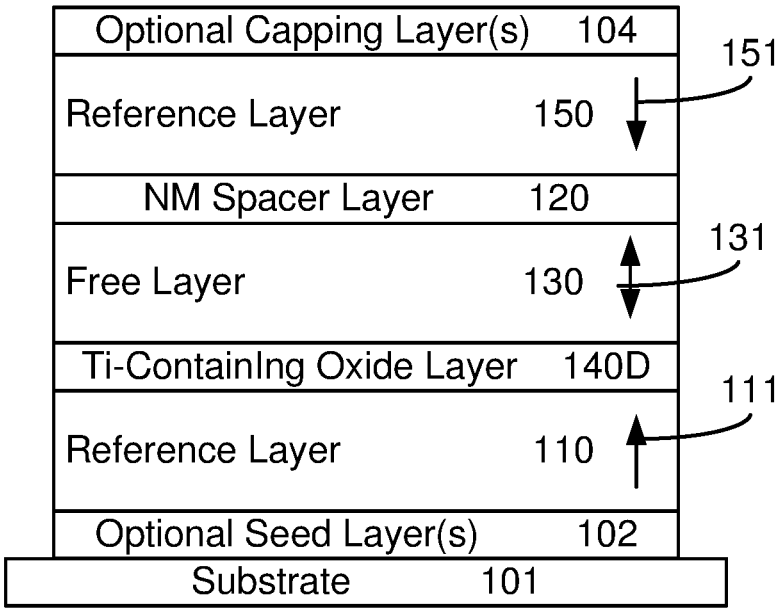
FIGS. 4A-4B depict exemplary embodiments of another magnetic junction usable in a magnetic memory, programmable using spin transfer torque and including at least one M-containing oxide layer.

FIG. 4A depicts another exemplary embodiment of a magnetic junction 100D in magnetic devices such as a magnetic memory programmable using spin transfer torque. For clarity, FIG. 4A is not to scale and not all components may be shown. The magnetic junction 100D is analogous to the magnetic junctions 100A, 100A', 100B, 100B', 100C and/or 100C'. Consequently, similar components have analogous labels. The magnetic junction 100D is a dual magnetic junction that includes reference layer 110, nonmagnetic spacer layer 120, free layer 130 having magnetic moment 131, M-containing oxide layer 140D and reference layer 150 that are analogous to the reference layer 110, nonmagnetic spacer layer 120, free layer 130 having magnetic moment 131, M-containing oxide layer 140A/140B/ 140C and reference layer 150, respectively. M includes at least one of Ti, Al, Hf, Zr, Mo, V, and Nb as described above. Optional seed layer 102 and capping layer 104 as well as the substrate 101 are also shown.

The structure, function and material(s) used for the reference layer 110, nonmagnetic spacer layer 120, free layer 130, M-containing oxide layer 140D and reference layer 150 in the magnetic junction 100D are analogous to those used for the reference layer 110/110', nonmagnetic spacer layer 120, free layer 130, M-containing oxide layer 140A/140B/ 140C and reference layer 150/150' in the magnetic junctions 100A, 100A', 100B, 100B', 100C and/or 100C'. For example, the M-containing oxide layer 140D may include $MgM_xO_y$ in the thicknesses described above with respect to the M-containing oxide layer 140A. Similarly, the free layer 130 may be a single layer or a multilayer and may be is written using spin transfer. In the embodiment shown in FIG. 4, however, the locations of the nonmagnetic spacer layer 120 and the M-containing oxide layer 140D have been switched.

The magnetic junction 100D shares the benefits of the magnetic junctions 100A, 100A', 100B, 100B', 100C and/or 100C'. The magnetic junction 100D is most analogous to the magnetic junction 100C. As described above, the magnetic junction 100D may have improved performance despite the use of higher temperature anneals. Thus, processes such as those used in semiconductor devices may be part of fabrication of a magnetic device including the magnetic junction 100D. Consequently, the magnetic junction 100D may be more easily and better incorporated into an electronic device without its performance unduly adversely affected.

Figure 4B:
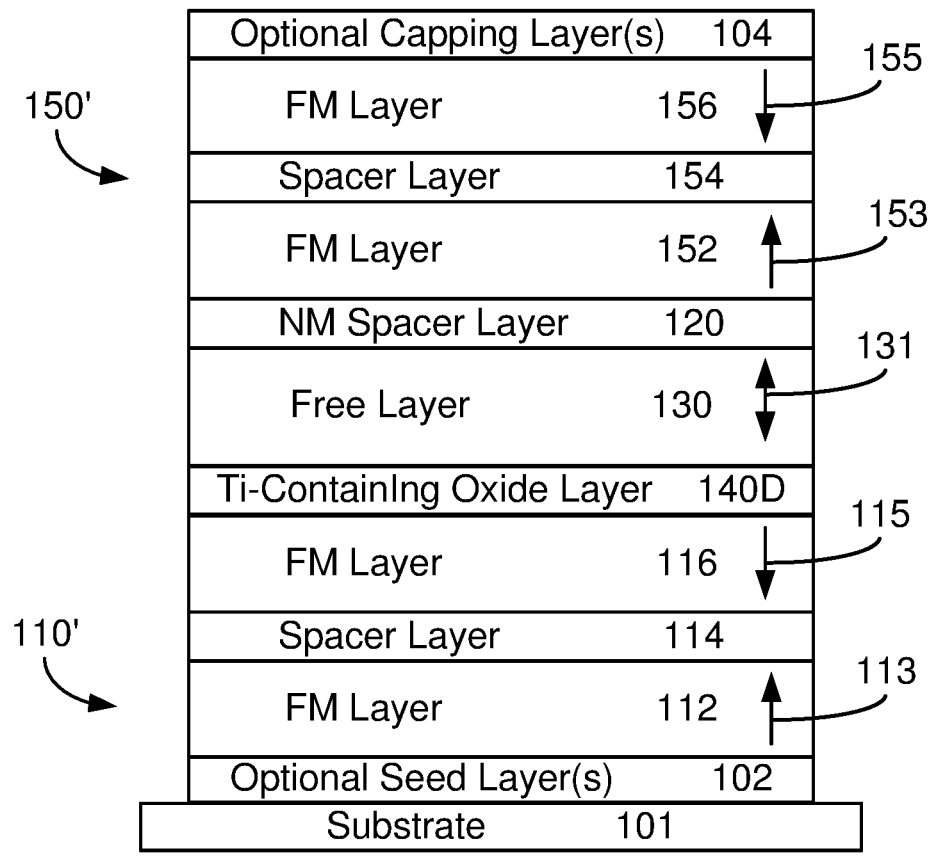

FIG. 4B depicts a magnetic junction 100D'. For clarity, FIG. 4B is not to scale and not all components may be shown. The magnetic junction 100D' is analogous to the magnetic junction(s) 100A, 100A', 100B, 100B', 100C, 100C' and/or 100D. Consequently, similar components have analogous labels. The magnetic junction 100D' includes reference layer 110', nonmagnetic spacer layer 120, free layer 130 having magnetic moment 131, M-containing oxide layer 140D and reference layer 150' that are analogous to the reference layer 110/110', nonmagnetic spacer layer 120, free layer 130, and M-containing oxide layer 140A/140B/140C and reference layer 150, respectively. Optional seed layer 102 and capping layer 104 as well as the substrate 101 are also shown.

The structure, function and material(s) used for the nonmagnetic spacer layer 120, free layer 130 and M-containing oxide layer 140C in the magnetic junction 100D' are analogous to those used in the magnetic junction(s) 100A, 100A', 100B, 100B', 100C, 100C' and/or 100D. For example, the M-containing oxide layer 140D may include $MgM_xO_y$ in the thicknesses described above. Similarly, the free layer 130 may be a single layer or a multilayer and may be is written using spin transfer. The reference layers 110' and 150' are explicitly shown as SAFs. The reference layers 110' and 150' in FIG. 4B are thus analogous to the reference layers 110' and 150' previously shown. In another embodiment the reference layer 150' may be a SAF while the reference layer 110' may be a single layer or a non-SAF multilayer. Similarly, the reference layer 110' may be a SAF while the reference layer 150' may be a single layer or a non-SAF multilayer. However, as in the magnetic junction 100D, the locations of the layers 120 and 140D have been switched from those shown in FIGS. 3A-3B.

The magnetic junction 100D' shares the benefits of the magnetic junction(s) 100A, 100A', 100B, 100B', 100C, 100C' and/or 100D. Use of a dual magnetic junction 100D' in the dual state may allow for a smaller write current for spin transfer. If the dual magnetic junction 100D' is in the antidual state, a larger signal may be achieved. The magnetic junction 100C' having the M-containing oxide layer 140C may also have improved performance despite the use of higher temperature anneals. An Mg-containing and M-containing oxide layer 140C may improve the PMA, coercivity, thermal stability constant and write efficiency. Because of the presence of M, these characteristics may not degrade by more than five percent despite anneal(s) of the magnetic junction 100C' at temperatures of up to four hundred degrees Celsius, up to four hundred and fifty degrees Celsius, or, in some embodiments, higher anneal temperature(s). Thus, processes such as those used in semiconductor devices may be part of fabrication of an electronic device including the magnetic junction 100C'. Consequently, the magnetic junction 100C' may be more easily and better incorporated into an electronic device without its performance unduly adversely affected.

Figure 5:
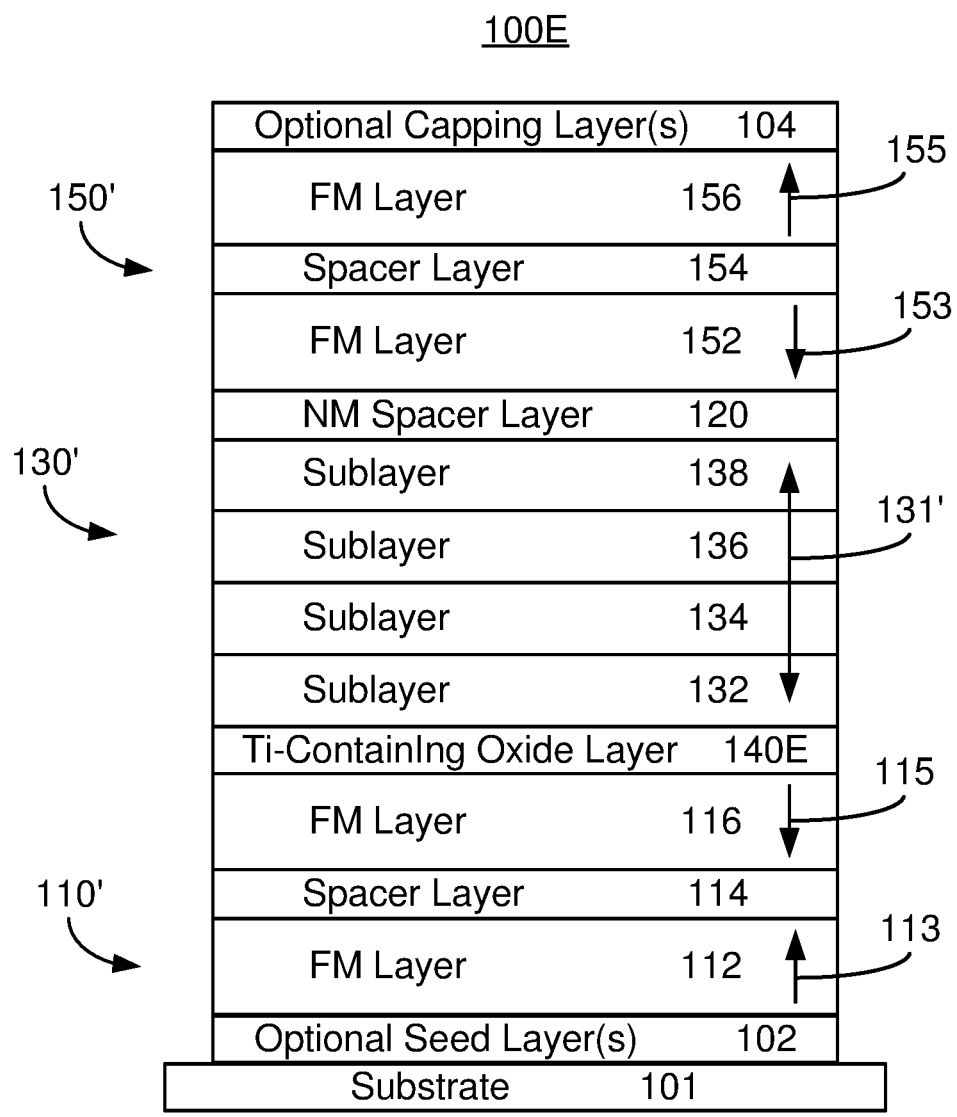
FIG. 5 depicts another exemplary embodiment of a magnetic junction usable in a magnetic memory, programmable using spin transfer torque and including at least one M-containing oxide layer.

FIG. 5 depicts another exemplary embodiment of a magnetic junction 100E in magnetic devices such as a magnetic memory programmable using spin transfer torque. For clarity, FIG. 5 is not to scale and not all components may be shown. The magnetic junction 100E is analogous to the magnetic junctions 100A, 100A', 100B, 100B', 100C, 100C', 100D and/or 100D'. Consequently, similar components have analogous labels. The magnetic junction 100E is a dual magnetic junction that includes reference layer 110', nonmagnetic spacer layer 120, free layer 130' having magnetic moment 131', M-containing oxide layer 140E and reference layer 150' that are analogous to the reference layer 110/110', nonmagnetic spacer layer 120, free layer 130 having magnetic moment 131, M-containing oxide layer 140A/140B/140C/140d and reference layer 150/150', respectively. M includes at least one of Ti, Al, Hf, Zr, Mo, V, and Nb as described above. Optional seed layer 102 and capping layer 104 as well as the substrate 101 are also shown.

The structure, function and material(s) used for the reference layer 110', nonmagnetic spacer layer 120, free layer 130, M-containing oxide layer 140E and reference layer 150 in the magnetic junction 100E are analogous to those used for the reference layer 110/110', nonmagnetic spacer layer 120, free layer 130, M-containing oxide layer 140A/140B/140C/140D and reference layer 150/150' in the magnetic junctions 100A, 100A', 100B, 100B', 100C, 100D and/or 100D'. For example, the M-containing oxide layer 140E may include $MgM_xO_y$ in the thicknesses described above with respect to the M-containing oxide layer 140A, 140B, 140C and 140D. Although depicted as SAFs, one or both of the reference layers 110' and 150' may be a single layer or a non-SAF multilayer. Further, one of the reference layers 110' or 150' may be removed. In such a case, the magnetic junction 100E is a top pinned magnetic junction or a bottom magnetic junction.

In the embodiment shown, the free layer 130' is explicitly depicted as a multilayer including sublayers 132, 134, 136 and 138. Some or all of the sublayers 132, 134, 136 and 138 may be magnetic. In addition, fewer or more sublayers may be present. In some embodiments, the free layer 130' is a SAF. In other embodiments, the free layer 130' may be a non-SAF multilayer. In other embodiments, the locations of the M-containing oxide layer 140E and the nonmagnetic spacer layer 120 may be exchanged.

The magnetic junction 100E shares the benefits of the magnetic junctions 100A, 100A', 100B, 100B', 100C, 100C', 100D and/or 100D'. The magnetic junction 100E may have improved performance despite the use of higher temperature anneals. Thus, processes such as those used in semiconductor devices may be part of fabrication of a magnetic device including the magnetic junction 100E. Consequently, the magnetic junction 100E may be more easily and better incorporated into an electronic device without its performance unduly adversely affected.

Figure 6:
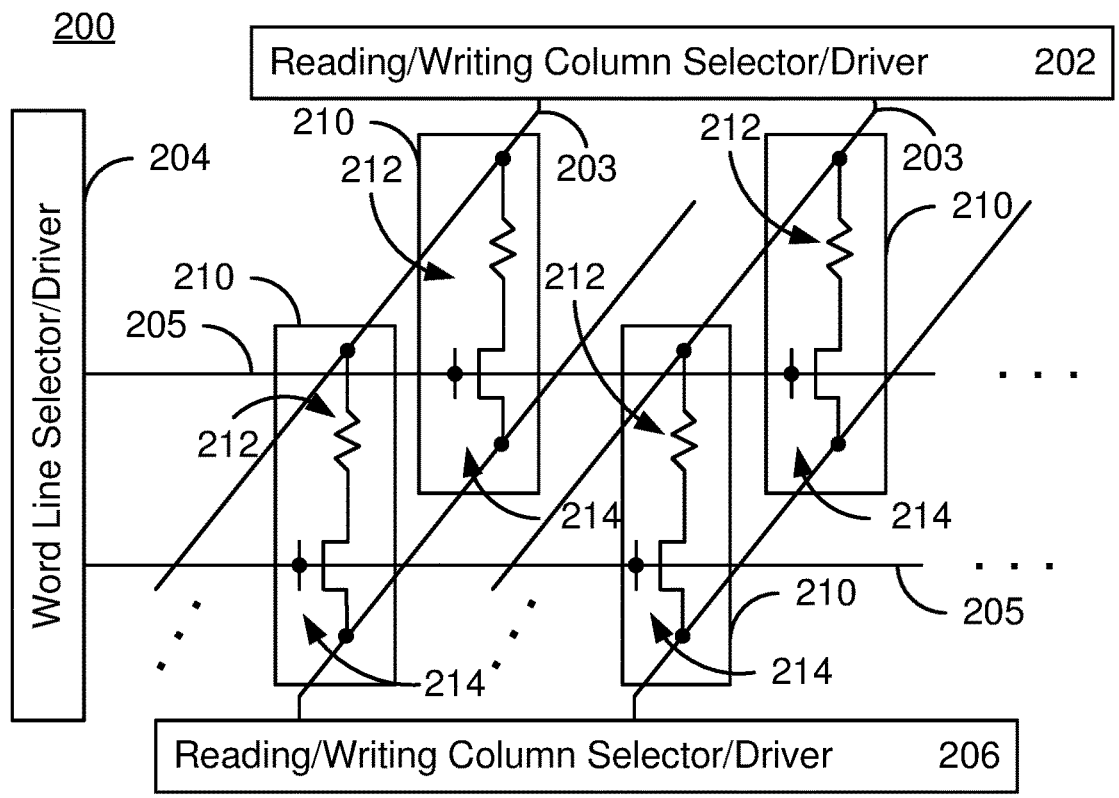
FIG. 6 depicts an exemplary embodiment of a memory utilizing magnetic junctions in the memory element(s) of the storage cell(s).

FIG. 6 depicts an exemplary embodiment of a memory 200 that may use one or more of the magnetic junctions 100A, 100A', 100B, 100B', 100C, 100C', 100D, 100D' and/or 100E and/or other magnetic junctions. The magnetic memory 200 includes reading/writing column select drivers 202 and 206 as well as word line select driver 204. Note that other and/or different components may be provided. The storage region of the memory 200 includes magnetic storage cells 210. Each magnetic storage cell includes at least one magnetic junction 212 and at least one selection device 214. In some embodiments, the selection device 214 is a transistor. The magnetic junctions 212 may be one of the 100A, 100A', 100B, 100B', 100C, 100C', 100D, 100D', 100E and/or other analogous magnetic junction(s). Although one magnetic junction 212 is shown per cell 210, in other embodiments, another number of magnetic junctions 212 may be provided per cell. Because the magnetic memory 200 includes one or more of the magnetic junctions 100A, 100A', 1008, 100B', 100C, 100C', 100D, 100D', 100E and/or an analogous magnetic junction, the magnetic memory 200 may enjoy the benefits described above.

Various features have been described with respect to the magnetic junctions 100A, 100A', 1008, 100B', 100C, 100C', 100D, 100D', 100E and the magnetic memory 200. One of ordinary skill in the art will recognize that these features may be combined in manner(s) not shown and which are not inconsistent with the devices and methods described herein.

Figure 7:
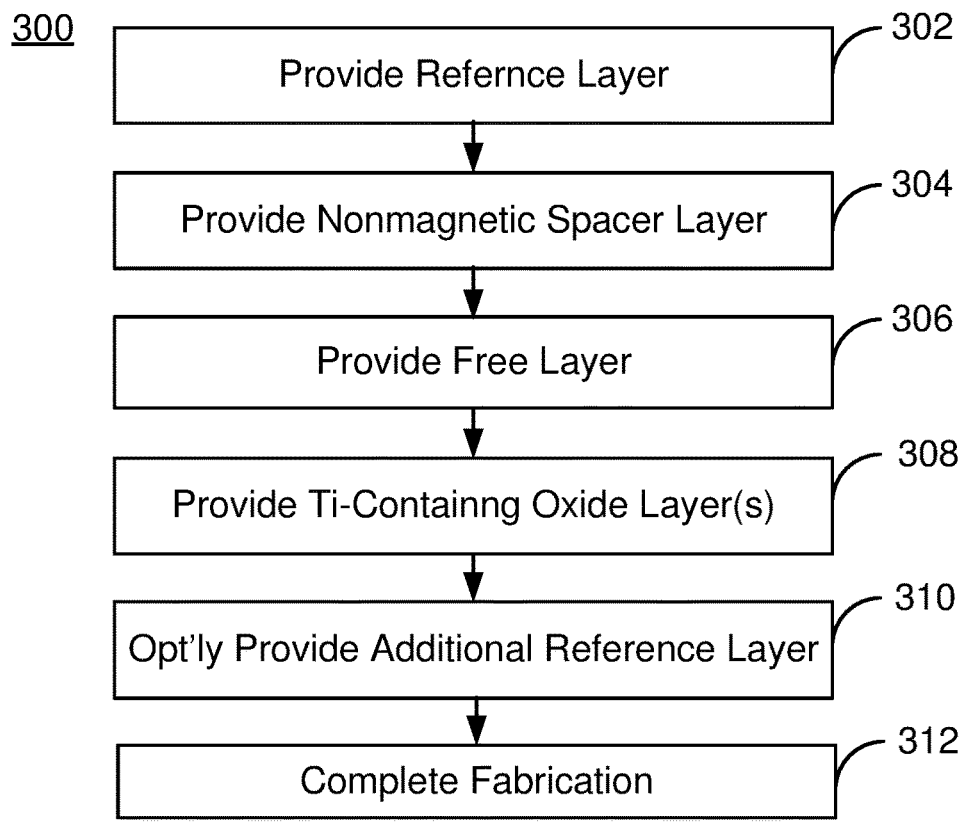
FIG. 7 is a flow chart depicting an exemplary embodiment of a method for providing a magnetic junction usable in a magnetic memory, programmable using spin transfer torque and including at least one M-containing oxide layer.

FIG. 7 depicts an exemplary embodiment of a method 300 for fabricating a magnetic junction usable in a magnetic device such as a spin transfer torque random access memory (STT-RAM) and, therefore, in a variety of electronic devices. For simplicity, some steps may be omitted, performed in another order and/or combined. Further, the method 300 may start after other steps in forming a magnetic memory have been performed. The method 300 is also described in the context of forming a single magnetic junction. However, multiple magnetic junctions may be formed substantially simultaneously. The method 300 is also described in the context of the magnetic junction 100E. However, another magnetic junction such as the magnetic junction(s) 100A, 100A', 100B, 100B', 100C, 100C', 100D, 100D' and/or 100E might be formed.

The reference layer 110' is provided, via step 302. The reference layer is magnetic and may have its magnetization pinned, or fixed, in a particular direction during at least a portion of the operation of the magnetic junction. The reference layer may thus be thermally stable at operating temperatures. The reference layer formed in step 302 may be a single layer or a multilayer. For example, the reference layer formed in step 302 may be a SAF, a single layer or another multilayer. The reference layer formed in step 302 may have a perpendicular anisotropy energy that exceeds the out-of-plane demagnetization energy. Thus, the reference layer may have its magnetic moment oriented perpendicular to plane. Other orientations of the magnetization of the reference layer are possible.

Step 302 may include depositing the reference layer on seed layer(s) 102. The seed layer(s) 102 may be selected for various purposes including but not limited to the desired crystal structure of the reference layer, magnetic anisotropy and/or other magnetic characteristics of the reference layer. For example, the reference layer may be provided on a seed layer such as a (100) crystalline MgO layer that promotes a perpendicular magnetic anisotropy in the reference layer. If a top pinned magnetic junction is formed, then step 302 may be omitted or the order of steps changed so that the free layer is closer to the substrate.

In addition, one or more polarization enhancement layers (PELs) may be provided as part of or in addition to providing the reference layer in step 302. A PEL includes high spin polarization materials. For example, a CoFeB PEL may be provided before and immediately after the reference layer is formed in step 302. In other embodiments, one or both of these PELs may be omitted.

A nonmagnetic spacer layer 120 is provided, via step 304. The nonmagnetic spacer layer 120 formed in step 304 may adjoin the reference layer 110/110' or may be separated from the reference layer by other layer(s) such as a PEL. In some embodiments, a crystalline MgO tunneling barrier layer may be formed. Step 304 may include depositing MgO, which forms a tunneling barrier layer. In some embodiments, step 304 may include depositing MgO using, for example, radio frequency (RF) sputtering. Metallic Mg may be deposited, then oxidized in step 306 to provide a natural oxide of Mg. The MgO barrier layer/nonmagnetic spacer layer may also be formed in another manner. Step 306 may include annealing the portion of the magnetic junction already formed to provide crystalline MgO tunneling barrier with a (100) orientation for enhanced tunneling magnetoresistance (TMR) of the magnetic junction.

The free layer 130 is provided, via step 306. Step 306 includes depositing the material(s) for the free layer. The free layer 130 provided in step 308 may be desired to have a perpendicular magnetic anisotropy that exceeds its demagnetization energy. The magnetic moment of the free layer may thus be stable out-of-plane, including perpendicular-to-plane. In addition, a PEL may be provided as part of or in addition to the free layer 130. The free layer 130 provided in step 306 is also configured to be switched between stable magnetic states when a write current is passed through the magnetic junction. Thus, the free layer 130 is switchable utilizing spin transfer torque. The free layer 130 provided in step 306 is magnetic and thermally stable at operating temperatures.

The M-containing layer 140E may optionally be provided, via step 308. Step 308 may include depositing the metal(s) for the M-containing oxide layer 140 and exposing the metal layer to an oxide treatment. Thus step 308 includes depositing at least one of Ti, Al, Hf, Zr, Mo, V, and Nb. In some embodiments, a plasma treatment may also be performed before the oxidation treatment. In other embodiments, the M-containing oxide layer may be radio frequency (RF) deposited so that an oxide if formed as-deposited. In other embodiments, the oxide layer 140 may be formed in a different manner.

An additional reference layer 150/150' may optionally be provided, via step 310. Step 310 is performed if a dual magnetic junction if provided. Fabrication of the magnetic junction may then be completed. For example, the capping layer(s) 104 may be deposited and the edges of the magnetic junction defined, for example by providing a mask on the layers that have been deposited and ion milling the exposed portions of the layers. Additional structures, such as contacts and conductive lines may also be formed for the device in which the magnetic junction is used.

Using the method 300, a free layer having improved switching characteristics despite the use of high temperature anneals may be provided. Thus, the method 300 may allow fabrication of a high perpendicular magnetic anisotropy having desired switching characteristics.

Figure 8:
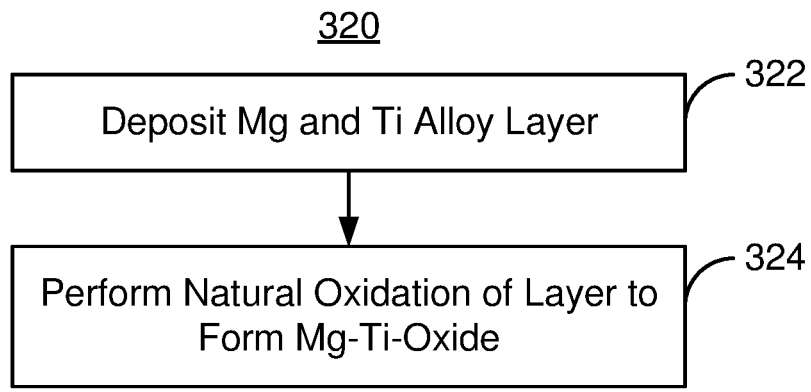
FIG. 8 is a flow chart depicting another exemplary embodiment of a method for providing an M-containing oxide layer in a magnetic junction usable in a magnetic memory and programmable using spin transfer torque.

FIG. 8 is a flow chart depicting an exemplary embodiment of a method 320 for providing a portion of a magnetic junction usable in a magnetic device and including at least one M-containing oxide layer. More specifically, the method 320 is used in forming the M-containing oxide layer. For simplicity, some steps may be omitted, performed in another order, include substeps and/or combined. Although described in terms of a single magnetic junction, multiple magnetic junctions may be fabricated. For simplicity, the method is described in the context of the magnetic junction 100A. However, the method 320 may be used for any of the magnetic junctions 100A', 1008, 100B', 100C, 100C', 100D, 100D' and/or 100F.

The metal layer(s) for the M-containing oxide layer 140A are deposited, via step 322. For example, step 322 may be performed by depositing an Mg-M alloy layer. The Mg-M alloy layer may be at least two atomic percent M and not more than ten atomic percent M in some embodiments. The alloy may be formed by sputtering Mg and M from separate targets or a composite target. A natural oxidation step is performed after deposition of the MgM alloy, via step 324. Thus, the layer(s) deposited in step 322 are exposed to an oxygen atmosphere and, optionally, heating of the magnetic junction. An $MgM_xO_y$ layer may thus be formed where $x \leq 3$ and $y \leq 5$.

Using the method 320, a M-containing oxide layer 140A that may improve the magnetic junction's ability to withstand higher temperature anneals is formed. Thus, the method 320 may allow fabrication of a magnetic junctions having improved switching characteristics and thermal stability and which may be more readily incorporated into magnetic devices.

Figure 9:
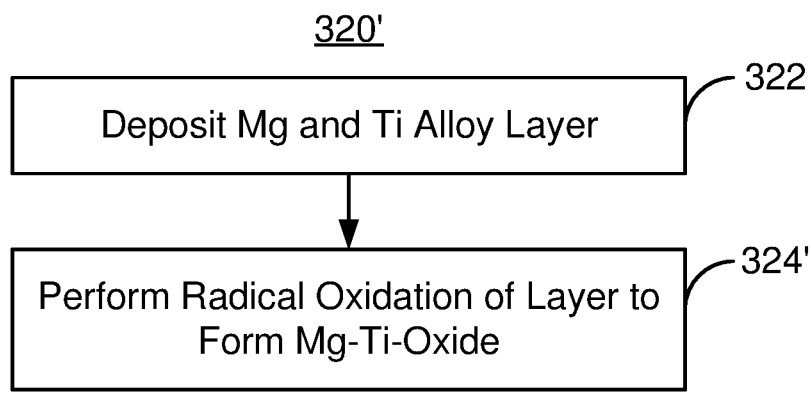
FIG. 9 is a flow chart depicting another exemplary embodiment of a method for providing an M-containing oxide layer in a magnetic junction usable in a magnetic memory and programmable using spin transfer torque.

FIG. 9 is a flow chart depicting an exemplary embodiment of a method 320' for providing a portion of a magnetic junction usable in a magnetic device and including at least one M-containing oxide layer. More specifically, the method 320 is used in forming the M-containing oxide layer. For simplicity, some steps may be omitted, performed in another order, include substeps and/or combined. Although described in terms of a single magnetic junction, multiple magnetic junctions may be fabricated. For simplicity, the method is described in the context of the magnetic junction 100A. However, the method 320 may be used for any of the magnetic junctions 100A', 1008, 100B', 100C, 100C', 100D, 100D' and/or 100F.

The metal layer(s) for the M-containing oxide layer 140A are deposited, via step 322. For example, step 322 may be performed by depositing an Mg-M alloy layer. The alloy may include at least two atomic percent and not more than ten atomic percent M. The alloy may be formed by sputtering Mg and M from separate targets or a composite target. A radical oxidation step is performed after deposition of the Mg-M alloy, via step 324'. Consequently, an $MgM_xO_y$ layer, where $x \leq 3$ and $y \leq 5$, is formed.

Using the method 320', a M-containing oxide layer 140A that may improve the magnetic junction's ability to withstand higher temperature anneals is formed. Thus, the method 320' may allow fabrication of a magnetic junctions having improved switching characteristics and thermal stability and which may be more readily incorporated into magnetic devices.

Figure 10:
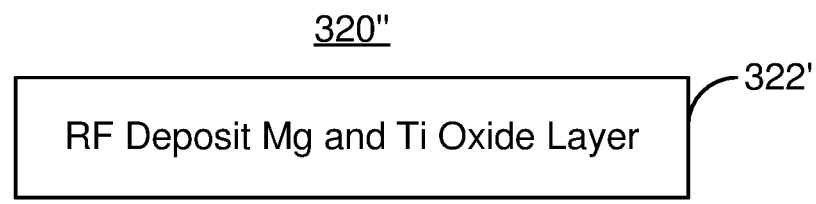
FIG. 10 is a flow chart depicting another exemplary embodiment of a method for providing an M-containing oxide layer in a magnetic junction usable in a magnetic memory and programmable using spin transfer torque.

FIG. 10 is a flow chart depicting an exemplary embodiment of a method 320" for providing a portion of a magnetic junction usable in a magnetic device and including at least one M-containing oxide layer. More specifically, the method 320" is used in forming the M-containing oxide layer. For simplicity, some steps may be omitted, performed in another order, include substeps and/or combined. Although described in terms of a single magnetic junction, multiple magnetic junctions may be fabricated. For simplicity, the method is described in the context of the magnetic junction 100A. However, the method 320 may be used for any of the magnetic junctions 100A', 100B, 100B', 100C, 100C', 100D, 100D' and/or 100F.

The metal(s) for the M-containing oxide layer 140A are RF deposited such that an oxide is formed as-deposited, via step 322'. For example, step 322 may be performed by RF sputtering Mg and M in a plasma that includes oxygen. Mg and M may be sputtered from separate targets or a composite target. In some embodiments, the sputtering target stoichiometry is ninety-five atomic percent Mg and five atomic percent M. However, the stoichiometry of the M-containing oxide layer 140A formed may differ.

Using the method 320, a M-containing oxide layer 140A that may improve the magnetic junction's ability to withstand higher temperature anneals is formed. Thus, the method 320 may allow fabrication of a magnetic junctions having improved switching characteristics and thermal stability and which may be more readily incorporated into magnetic devices.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction residing on a substrate and usable in a magnetic device, the magnetic junction comprising:
   a reference layer;
   a nonmagnetic spacer layer;
   a free layer, the free layer being switchable between a plurality of stable magnetic states in response to a write current being passed through the magnetic junction, the nonmagnetic spacer layer residing between the reference layer and the free layer; and
   an M-containing oxide layer adjacent to the free layer, M includes Ti, the M-containing oxide layer including $[MgTi_x]O_y$, where x is at least 0.02 and not greater than 0.1 and y is not greater than 5, the free layer being between the nonmagnetic spacer layer and the M-containing oxide layer; and
   wherein the free layer is formed using an anneal of up to four hundred and fifty degrees Celsius and wherein the free layer has a first coercivity, a first thermal stability coefficient and a first write efficiency before the anneal, the free layer has second coercivity, a second thermal stability coefficient and a second write efficiency after the anneal, the second coercivity being within five percent of the first coercivity, the second write efficiency being within five percent of the first write efficiency and the second thermal stability coefficient being within five percent of the first thermal stability coefficient.

2. The magnetic junction of claim 1, wherein the M-containing oxide layer has a thickness of at least four Angstroms and not more than eight Angstroms.

3. The magnetic junction of claim 1, wherein the free layer includes at least one of Co, Fe, Ni and B.

4. The magnetic junction of claim 1, wherein the anneal is at at least one anneal temperature of at least four hundred degrees Celsius, the first coercivity, the first thermal stability coefficient and the first write efficiency do not decrease by more than five percent after the anneal of up to four hundred fifty degrees Celsius.

5. The magnetic junction of claim 1, further comprising:
   an additional reference layer, the M-containing oxide layer being between the free layer and the additional reference layer such that the magnetic junction is a dual magnetic junction.

6. The magnetic junction of claim 1, wherein the nonmagnetic spacer layer is selected from a crystalline MgO tunneling barrier layer, a conductive nonmagnetic spacer layer and an other tunneling barrier layer.

7. A magnetic memory residing on a substrate and comprising:
a plurality of magnetic storage cells, each of the plurality of magnetic storage cells including a reference layer, a nonmagnetic spacer layer, a free layer, and an M-containing oxide layer, the free layer being switchable between a plurality of stable magnetic states in response to a write current being passed through the magnetic junction, the nonmagnetic spacer layer residing between the reference layer and the free layer, the M-containing oxide layer being adjacent to the free layer, the free layer being between the nonmagnetic spacer layer and the M-containing oxide layer, M including Ti, the M-containing oxide layer including $[MgTi_x]O_y$, where x is at least 0.02 and not greater than 0.1 and y is not greater than 5, wherein the free layer is formed using an anneal of up to four hundred and fifty degrees Celsius and wherein the free layer has a first coercivity, a first thermal stability coefficient and a first write efficiency before the anneal, the free layer has second coercivity, a second thermal stability coefficient and a second write efficiency after the anneal, the second coercivity being within five percent of the first coercivity, the second write efficiency being within five percent of the first write efficiency and the second thermal stability coefficient being within five percent of the first thermal stability coefficient; and
a plurality of bit lines coupled with the plurality of magnetic storage cells.

8. A method for providing a magnetic junction usable in a magnetic device, the method comprising:
providing a reference layer;
providing a nonmagnetic spacer layer;
providing a free layer, the free layer being switchable between a plurality of stable magnetic states in response to a write current being passed through the magnetic junction, the nonmagnetic spacer layer residing between the reference layer and the free layer;
providing an M-containing oxide layer adjacent to the free layer, the free layer being between the nonmagnetic spacer layer and the M-containing oxide layer, M including Ti, the M-containing oxide layer including $[MgTi_x]O_y$, where x is at least 0.02 and not greater than 0.1 and y is not greater than 5;
performing an anneal of up to four hundred and fifty degrees Celsius, wherein the free layer has a first coercivity, a first thermal stability coefficient and a first write efficiency before the anneal, the free layer has second coercivity, a second thermal stability coefficient and a second write efficiency after the anneal, the second coercivity being within five percent of the first coercivity, the second write efficiency being within five percent of the first write efficiency and the second thermal stability coefficient being within five percent of the first thermal stability coefficient.

9. The method of claim 8, wherein the providing the M-containing oxide layer further includes:
depositing at least one $MgTi_x$ layer; and
naturally oxidizing the at least one $MgTi_x$ layer.

10. The method of claim 8, wherein the providing the M-containing oxide layer further includes:
depositing at least one $MgTi_x$ layer; and
oxidizing the at least one $MgTi_x$ layer using a radical oxidation process.

11. The method of claim 8, wherein the providing the M-containing oxide layer further includes:
depositing at least one $O_y$ layer where y<5.

12. The method of claim 8, wherein the M-containing oxide layer has a thickness of at least four Angstroms and not more than eight Angstroms.

13. The method of claim 8, wherein the performing the anneal further includes:
performing the anneal at at least one anneal temperature of at least four hundred degrees Celsius after the providing the M-containing oxide layer, and wherein the first coercivity, the first thermal stability coefficient and the first write efficiency do not decrease by more than five percent after the anneal.

14. The method of claim 8 further comprising:
providing an additional reference layer, the M-containing oxide layer being between the free layer and the additional reference layer such that the magnetic junction is a dual magnetic junction.

15. The method of claim 8, wherein the nonmagnetic spacer layer is selected from a crystalline MgO tunneling barrier layer, a conductive nonmagnetic spacer layer and another tunneling barrier layer.

* * * * *